United States Patent
Hode

(10) Patent No.: US 8,102,290 B2
(45) Date of Patent: Jan. 24, 2012

(54) SIGMA-DELTA MODULATOR

(75) Inventor: Jean-Michel Hode, St Cloud (FR)

(73) Assignee: Thales, Neuilly sur Seine (FR)

( * ) Notice: Subject to any disclaimer, the term of this patent is extended or adjusted under 35 U.S.C. 154(b) by 0 days.

(21) Appl. No.: 12/513,092

(22) PCT Filed: Oct. 26, 2007

(86) PCT No.: PCT/EP2007/061568
§ 371 (c)(1),
(2), (4) Date: Jul. 22, 2009

(87) PCT Pub. No.: WO2008/052949
PCT Pub. Date: May 8, 2008

(65) Prior Publication Data
US 2009/0322576 A1 Dec. 31, 2009

(30) Foreign Application Priority Data
Oct. 31, 2006 (FR) ..................... 06 09561

(51) Int. Cl.
*H03M 3/00* (2006.01)
(52) U.S. Cl. ......... 341/143; 341/118; 341/120; 341/155
(58) Field of Classification Search .......... 341/143, 341/118, 120, 155
See application file for complete search history.

(56) References Cited

U.S. PATENT DOCUMENTS

| | | | |
|---|---|---|---|
| 5,907,299 A * | 5/1999 | Green et al. ................. | 341/143 |
| 5,977,895 A | 11/1999 | Murota et al. | |
| 6,496,128 B2 * | 12/2002 | Wiesbauer et al. ........... | 341/143 |
| 6,839,011 B1 * | 1/2005 | Hong ............................. | 341/143 |
| 6,998,910 B2 * | 2/2006 | Hezar et al. .................... | 330/10 |
| 7,362,247 B2 * | 4/2008 | Arias et al. .................... | 341/120 |
| 7,362,252 B1 * | 4/2008 | Pai ................................ | 341/143 |
| 2002/0030618 A1 | 3/2002 | Cusinato et al. | |
| 2005/0116850 A1 * | 6/2005 | Hezar et al. .................. | 341/143 |
| 2005/0237233 A1 * | 10/2005 | Muhammad .................. | 341/143 |
| 2006/0092059 A1 * | 5/2006 | Guimaraes .................... | 341/143 |
| 2006/0097899 A1 * | 5/2006 | Nagai ............................ | 341/143 |
| 2008/0278360 A1 * | 11/2008 | Koli .............................. | 341/143 |

(Continued)

FOREIGN PATENT DOCUMENTS

JP 63248222 A 10/1988

OTHER PUBLICATIONS

Thomas, K. Praveen Jayakar et al. "A 1GHz CMOS Fourth-Order Continuous-Time Bandpass Sigma Delta Modulator for RF Receiver Front End A/D Conversion," Design Automation Conference Proceedings of the ASP-DAC, Shanghai, China, pp. 665-670. (Jan. 18-21, 2005).

(Continued)

*Primary Examiner* — Linh Nguyen
(74) *Attorney, Agent, or Firm* — Stroock & Stroock & Lavan LLP

(57) ABSTRACT

The present invention relates to a sigma-delta modulator to convert an analog signal into a digital signal using an analog-to-digital converter slaved in a closed loop. The undecided bits at the output of the analog-to-digital converter are assigned the same values in the digital output signal from the modulator as in the digital signal returned to the input of the modulator.

6 Claims, 3 Drawing Sheets

U.S. PATENT DOCUMENTS

Figure 2A:
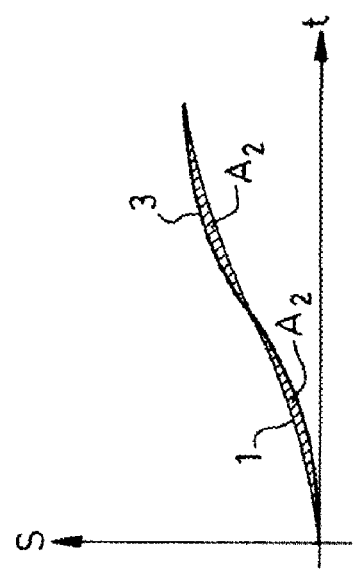

| | | | | |
|---|---|---|---|---|
| 2008/0309536 | A1* | 12/2008 | Le Guillou et al. | 341/143 |
| 2009/0021409 | A1* | 1/2009 | Mathe et al. | 341/143 |
| 2009/0219185 | A1* | 9/2009 | Sundstrom et al. | 341/118 |
| 2010/0066577 | A1* | 3/2010 | Huang | 341/143 |
| 2010/0219998 | A1* | 9/2010 | Oliaei | 341/143 |

OTHER PUBLICATIONS

Kaplan, Todd et al. "A 1.3-GHz IF Digitizer Using a 4th-Order Continuous-Time Bandpass ΔΣ Modulator," Proceedings of the IEEE 2003 Custom Integrated Circuits Conference, San Jose, CA, pp. 127-130. (Sep. 21-24, 2003).

Stubberud, Peter et al. "Metastability Requirements for a 2GHz CMOS ΔΣ Modulator," Proceedings of the 18th International Conference on Systems Engineering, pp. 263-268. (Aug. 18, 2005).

International Search Report from PCT/EP2007/061568, issued Nov. 30, 2007.

Written Opinion from PCT/EP2007/061568, issued Nov. 30, 2007.

International Preliminary Report on Patentability from PCT/EP2007/061568, issued Sep. 25, 2008.

* cited by examiner

SIGMA-DELTA MODULATOR

This is a U.S. National Phase Application under 35 U.S.C. §371 of International Application no. PCT/EP2007/061568, filed Oct. 26, 2007, and claims benefit of French Patent Application No. 06 09561, filed Oct. 31, 2006, both of which are incorporated herein. The International Application was published in French on May 8, 2008 as WO 2008/053949 under PCT Article 21 (2).

The present invention relates to a sigma-delta modulator making it possible to convert an analog signal into a digital signal using an analog-to-digital converter slaved in a closed loop. It applies notably in the field of electronics.

The conversion of an analog signal into a digital signal has become a conventional operation in contemporary electronic circuits, by virtue of standard off-the-shelf components commonly lumped together under the acronym ADC standing for "Analog-to-Digital Converter". This involves representing a signal e(t) that varies in a continuous manner over time and can take any value in a form s(t) sampled over time. Each sample can take a finite number of possible quantized values and each value is coded on a well determined number of bits. Each bit can take only two possible values, 1 or −1 for example.

Conventional ADCs offer performance ratings in terms of precision which are sufficient at relatively low frequencies of the input signal, of the order of a few megahertz. This implies that at these frequencies, the difference between the signal represented digitally at output and the analog input signal is acceptable. But in the microwave frequency domain, when the frequency of the input signal is of the order of several gigahertz, the dynamics of conventional ADCs, that is to say their ability to rapidly sample/quantize the input signal, turns out to be markedly insufficient. Firstly, this is due to a phenomenon of remanence on an internal component of ADCs called a sample-and-hold unit. It is hard for a sample-and-hold unit to stabilize an input signal with a view to quantizing it if it is at too high a frequency: the duration of stabilization becomes too short and the amplitudes between the samples to be stabilized too high. This introduces errors, that is to say digital samples may not be representative of the analog signal. Thus, at high frequency the difference between the signal represented digitally at output and the analog signal at input becomes non-negligible and the precision of the ADC is no longer sufficient. To summarize, the precision of conventional ADCs decreases when the frequency of the analog signal e(t) applied to their input increases. They are therefore not suitable for use in applications at very high frequencies demanding good digital precision, such as radars for example.

A method called $\Sigma\Delta$ modulation makes it possible to improve the precision of an ADC locally around a frequency, optionally around a high frequency. As illustrated subsequently, the basic idea is to arbitrarily vary the digital output signal, or to "modulate" it, so as to minimize the error in the power, even if by so doing, some samples of the digital output signal may seem unrepresentative of the analog input signal. For this purpose, $\Sigma\Delta$ modulation relies notably on a principle of over-sampling of the input signal on a small number of bits. This involves on the one hand increasing the temporal precision by splitting the signal into a large number of very brief samples. Moreover, this involves decreasing the precision in terms of amplitude since, for each sample, very few distinct values of amplitude are coded, using few bits. Intrinsically, this generates an error due to the lack of precision in the quantization of the amplitude of each sample. Consequently, the error inherent in any method of digitization and improperly called "quantization noise", is significant. But by relying on over-sampling, the digital output signal is modulated as explained previously, thereby making it possible to minimize the power of this quantization noise in a determined frequency band.

In the frequency domain or spectral domain, it is commonly said that $\Sigma\Delta$ modulation "conforms" the quantization noise. Specifically, the modulation of the digital output signal, which modulation is suited to the frequency of the input signal, amounts to minimizing the power of the quantization noise around this frequency, or else to decreasing the spectral density of the quantization noise around the useful signal. In fact, the spectrum of the quantization noise should be made to "conform" to an ideal spectrum exhibiting a trough in the neighborhood of the frequency of use. Thus, even if significant quantization noise is intrinsically generated in $\Sigma\Delta$ modulation whatever the frequency of the signal at input, at least this quantization noise is of low power in the neighborhood of the frequency of use. In practice and as explained subsequently, a $\Sigma\Delta$ modulator is obtained by "compressing" the noise at the frequency of use.

A $\Sigma\Delta$ modulator can be implemented on the basis of an ADC slaved in a slaving loop in a conventional manner, with a view to attenuating the influence of its quantization noise on its digital output. In this case, a digital-to-analog converter, called a DAC subsequently, makes it possible to re-convert into analog the digital output signal from the ADC with a view to subtracting it from the input signal based on the principle of the closed slaving loop. An amplifier and a filter in the loop make it possible to circumvent the drawback of conventional ADCs: they make it possible to associate high frequency and fine resolution. As detailed subsequently, the architecture of such a circuit is quite remarkable, since it applies conventional layout principles to very specific components, the individual behavior of the components always being complementary to the layout principles. This allows the whole system to converge in a rather more natural manner to the sought-after aim.

It should be noted that it is quite possible to return to the input only a reduced number of bits arising from the ADC, for example the most significant bits, which will subsequently be designated by the acronym MSB standing for "Most Significant Bit". In this case, the remaining bits, namely the least significant bits which will subsequently be designated by the acronym LSB standing for "Less Significant Bit", constitute a measure of the error made by the $\Sigma\Delta$ modulator, which measure can be exploited digitally to reduce the noise in the band, provided that one knows the complete digital transfer function, that is to say in terms of amplitude and phase, of the modulator in open loop.

However, in addition to the remanence phenomenon observed at very high frequency of the input signal on the sample-and-hold units of an ADC and to which the $\Sigma\Delta$ modulation proposes to afford a response, a phenomenon of "metastability" arises with other components of ADCs called the comparators. Metastability is a known phenomenon of indecision in ADCs which is all the more significant as the sampling frequency increases and therefore as the processing time decreases. This phenomenon has always existed, but with the increase in the operating speed of contemporary digital circuits, it has become a primary rather than a secondary concern. Because of this phenomenon, which is detailed subsequently, certain bits may not be decided at the output of an ADC in a $\Sigma\Delta$ modulator: they equal neither −1 nor 1. It is logic layers situated after the comparators of the ADC which lift these indecisions in a totally independent manner, on the one hand for the digital output signal and on the other hand for the digital signal returned to the input of the modulator. Thus nothing guarantees that the liftings of indecision are consistent or homogeneous between the digital output signal and the digital signal returned to the input. The difference between these two signals should be considered to be an added error.

The phenomenon of metastability is very troublesome to ΣΔ modulators. Specifically, in cases of indecision the principle of the closed slaving loop is not effective, since the difference e−s calculated might not be representative of the real difference between the loop input and the output from the ADC or from the modulator.

Contemporary ΣΔ modulators put up with this added error, banking on the fact that cases of undecided bits are rare, constituting a glitch from time to time. For example, one in every $10^9$ bits may remain undecided. However, if the error pertains to a high-order bit, this may correspond to an error in power of −80 to −90 decibels.

The aim of the invention is notably to alleviate the aforesaid drawback by ensuring that even if an error is made at the output of a DAC, that is to say if the decision taken by the registers of the DAC does not correctly resolve the indecision left by the ADC, in any event this error is found at one and the same time at the output of the modulator and in the looped-back signal. In this way the principle of the slaving loop remains effective in all cases, even in case of error. For this purpose, the subject of the invention is essentially a sigma-delta modulator making it possible to convert an analog signal into a digital signal using an analog-to-digital converter, the digital output signal being subtracted from the input signal after conversion by a digital-to-analog converter and this difference being filtered and amplified by a high factor on input to the analog-to-digital converter. The undecided bits at the output of the analog-to-digital converter are assigned the same values in the digital output signal from the modulator and in the digital signal returned to the input of the modulator.

For example, the digital output of the modulator can be situated after definitive values have been assigned to the undecided bits for the digital signal returned to the input of the modulator. The digital output signal of the modulator can be the conversion into digital of the analog signal sampled, quantized and held at the output of the digital-to-analog converter, by use of a simple analog-to-digital converter for example.

Or else, the digital output signal of the modulator can be obtained by transforming into binary code the voltages for controlling the switches of the current sources of the digital-to-analog converter.

Embodiments of the invention have the main advantage that it can be implemented in an elementary manner and at minimum cost, optionally requiring only the addition of a mediocre ADC of low complexity, without sample-and-hold units, so as simply to return an already sampled and quantized analog signal to digital form.

Figure 1A:
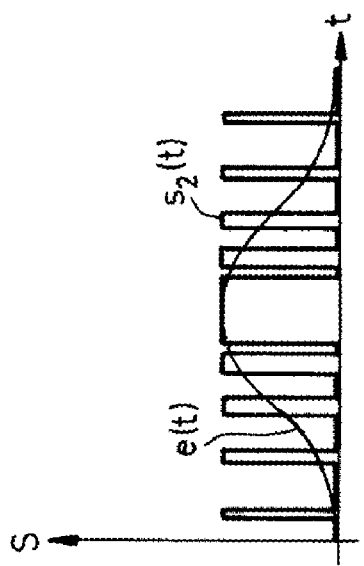
Figure 2B:
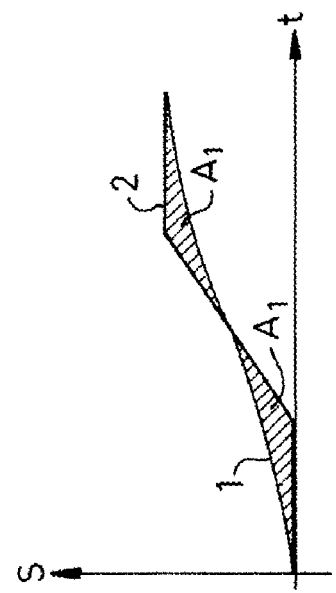
Figure 3A:
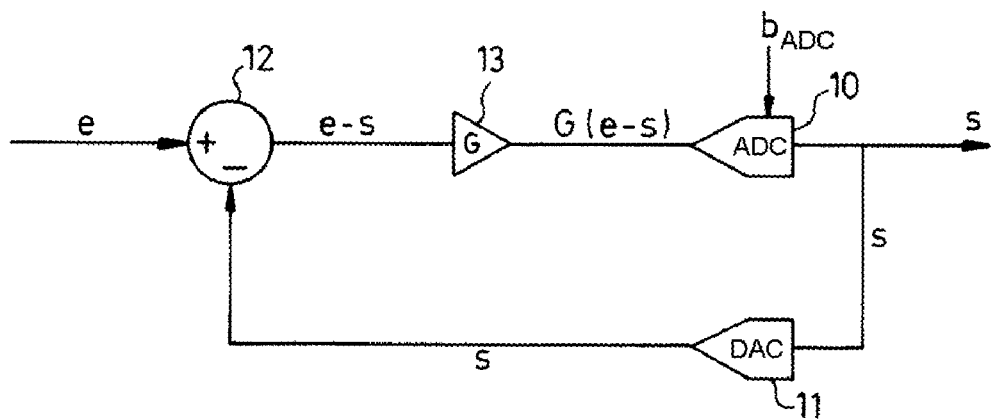
Figure 3B:
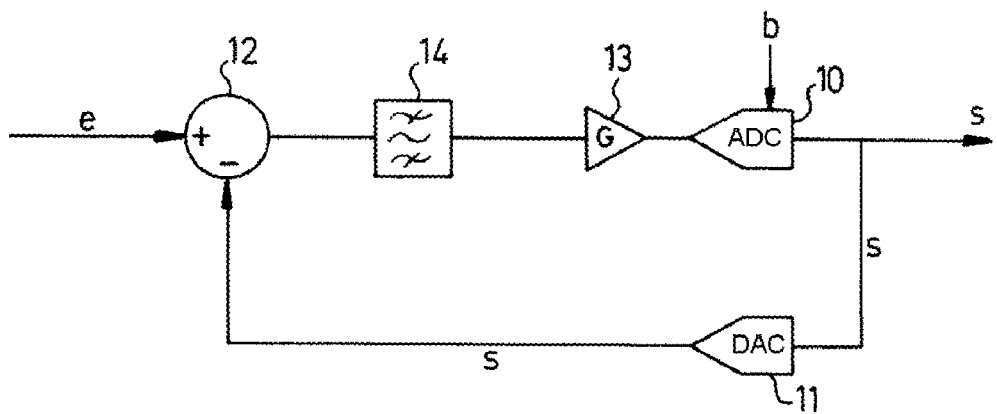
Figure 4:
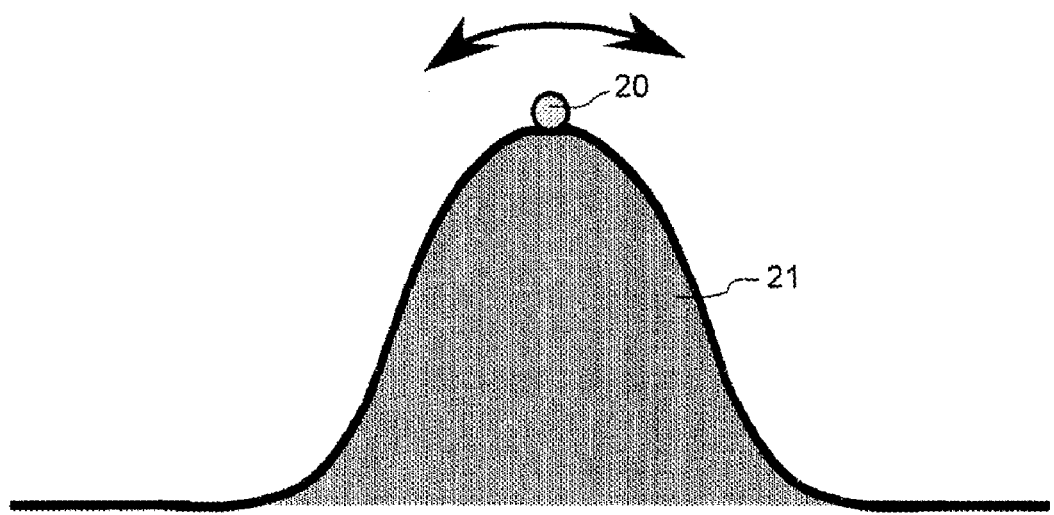
Figure 5:
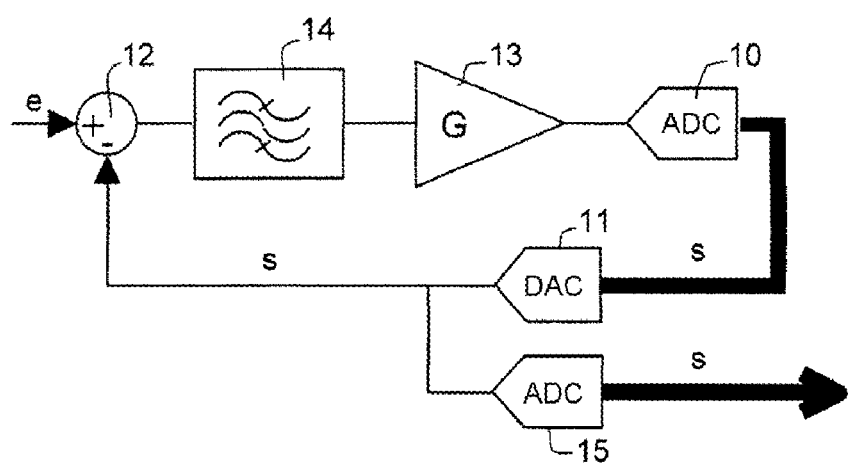

Other characteristics and advantages of one or more embodiments of the invention will become apparent with the aid of the description which follows, offered in relation to appended drawings which represent:

FIGS. 1a, 1b, 2a and 2b, by graphs an illustration of the principle of ΣΔ modulation, FIGS. 3a and 3b, by schematics an exemplary embodiment of a ΣΔ modulator, FIG. 4, by a diagram a mechanical analogy of the phenomenon of metastability, FIG. 5, by a schematic an example of a ΣΔ modulator according to one or more embodiments of the invention.

FIGS. 1a, 1b, 2a and 2b, illustrate by graphs the principle of ΣΔ modulation in the case of single-bit baseband operation.

Figure 1B:
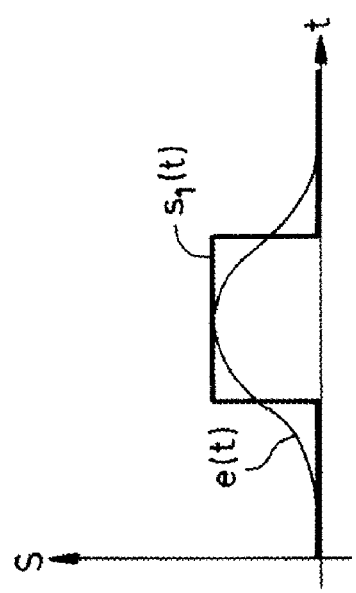

As illustrated by FIG. 1a, an analog signal e(t) can be converted into a digital signal $s_1(t)$ on 1 bit at low sampling frequency. FIG. 1b then illustrates the error made in the power of the signal by an area $A_1$ situated between the integral of e(t) represented by a curve 1 and the integral of $s_1(t)$ represented by a curve 2.

Likewise and as illustrated by FIG. 2a, the analog signal e(t) can also be converted into a digital signal $s_2(t)$, still on 1 bit but at higher sampling frequency. The digital signal $s_2(t)$ exhibits arbitrary variations or "modulations", that is to say samples which may seem unrepresentative of the analog input signal e(t). However, FIG. 2b illustrates the error made in the power of the signal by an area $A_2$ situated between the integral of e(t) represented by curve 1 and the integral of $s_2(t)$ represented by a curve 3.

It is clearly apparent that the error $A_2$ made in terms of power by approximating e(t) by the modulated signal $s_2(t)$ is lower than the error $A_1$ made in terms of power by approximating e(t) by the unmodulated signal $s_1(t)$. This is what makes it possible to minimize the power of the quantization noise.

FIGS. 3a and 3b illustrate by schematics an exemplary embodiment of a ΣΔ modulator.

As illustrated by FIG. 3a, a ΣΔ modulator can be implemented on the basis of an ADC 10 slaved in a loop closed in a conventional manner. The ADC 10 is disposed in a closed slaving loop with a view to attenuating the influence of its quantization noise $b_{ADC}$ on its digital output s as a function of an analog input signal e to be converted. The closed slaving loop comprises a summator 12 taking e and s as input and whose role in the loop is to carry out the subtraction operation e−s (Δ operation of the modulator) through the principle of the closed slaving loop. The circuit portion between the output of the ΣΔ modulator and the input of the summator 12 which makes it possible to send s to the summator 12 is commonly called the "loop return". In the particular case of FIG. 3a, the loop return comprises in addition a digital-to-analog converter 11, which will be called the loop return DAC subsequently, which makes it possible to re-convert into analog the digital signal s output by the ADC 10 with a view to subtracting it from the input signal e through the principle of the closed slaving loop. An amplifier 13 of high gain G thereafter amplifies e−s. The role of the amplifier 13 in the loop is to "compress" the noise $b_{ADC}$ through the principle of the closed slaving loop. Specifically, if the signal e were applied directly to the input of the ADC 10, that is to say if the ADC 10 was not slaved in a closed loop, then the signal s at the output of the ADC 10 would be $s = e + b_{ADC}$ and the signal-to-noise ratio would be equal to $$\frac{e}{b_{ADC}}.$$

Whereas if the ADC 10 is slaved in a closed loop as illustrated by FIG. 3a, it is easily shown that the signal s at the output of the ADC 10 and the associated signal-to-noise ratio (SNR) are given by the following relations (1) and (2):

$$s = \frac{b_{ADC}}{1+G} + \frac{G}{1+G} e \quad (1)$$

$$SNR = G \times \frac{e}{b_{ADC}} \quad (2)$$

Now, G is high through the principle of the closed slaving loop, therefore $$\frac{1}{1+G} \approx 0 \text{ and } \frac{G}{1+G} \approx 1.$$

Thus s≈e and the signal-to-noise ratio is improved by a high factor G. Thereby, the amplifier 13 of high gain G "compresses" by a factor $$\frac{1}{1+G}$$

the quantization noise $b_{ADC}$ induced by the ADC 10.

A closed slaving loop is a generic layout in electronics for compressing the noise of a component. In the example of FIG. 3a, a slaving loop is applied to the ADC 10 to compress its quantization noise $b_{ADC}$. Only the loop return DAC 11 is a specific feature which is not given by the principle of the closed slaving loop. It makes it possible to return s to the same mode of analog representation as the signal e and thus enables e−s to be calculated.

A major drawback of the circuit of FIG. 3a slaving the ADC 10 is the temporal delay of the signal s over the signal e. This delay is inherent in the closed slaving loop principle. Its application to an ADC can constitute a serious problem of stability through an effect comparable with the Larsen effect, since the two operations of converting from analog to digital and then from digital to analog are particularly expensive in terms of time. More precisely, a study of the stability of ΣΔ modulators conducted by Thales has shown that the product G×B×T, where B is the band of the modulator and T the delay of the loop, cannot exceed a certain value depending on the stiffness of the frequency response of the modulator.

To obtain a stable loop and as illustrated by FIG. 3b, a filtering component 14 with minimum phase variation is inserted between the summator 12 and the amplifier 13 and carries out an integration operation (Σ operation of the modulator). The component 14 which filters the high frequencies outside of the useful band targeted by the ΣΔ modulator is carried out in such a way that the global frequency response (in terms of amplitude and phase) of the loop complies with the Nyquist stability criterion. It should be noted that filtering in a ΣΔ modulator forms the subject of a patent filed by Thales.

Thus, the amplifier 13 and the filter 14 in the feedback loop of FIG. 3b make it possible by combination to circumvent the drawback of conventional ADCs: they make it possible to associate high frequency and fine resolution. The amplifier 13 compresses the quantization noise, and therefore decreases the error and increases the precision. The filter 14 makes it possible to increase the frequency by preventing the loop from diverging.

The architecture of the circuit of FIG. 3b is quite remarkable, since it applies conventional layout principles to very specific components, the individual behavior of the components always being complementary to the layout principles. This allows the whole system to converge in a rather more natural manner to the sought-after aim.

FIG. 4 illustrates the phenomenon of metastability through a conventional mechanical analogy: that of the behavior of a ball 20 on the ridge of a hill 21. The stable states of the ball 20 are situated on either side of the hill 21. There is metastability if the ball 20 is at the top of the hill 21. Specifically, it is immediately seen that the ball 20 may, in certain cases where it is very near the ridge of the hill 21, take a very long time before rolling to one side or the other. In theory, it could even take an infinite time before attaining a stable state. In practice, however, there is always a disturbing element which ends up making it roll to one side or the other, such as the wind or vibrations.

Just as the ball 20 placed exactly at the ridge of the hill 21 may take time to roll to one side or the other, when the signal applied to the comparators of the ADC 10 of FIG. 3b is too close to one of the decision thresholds, the comparators concerned have difficulties in deciding the logic level of their output. For example, if a signal less than 0 is coded −1 and a signal greater than 0 is coded +1, and if the signal applied equals 0+ϵ with ϵ very small, the comparators may not be capable of differentiating between 0−ϵ and 0+ϵ and therefore be incapable of deciding between −1 and 1. It is this phenomenon that is called metastability in the context of ADCs. And the higher the working frequency, the more accentuated the phenomenon, since the quicker the comparators have to decide, and the more chance they have of not having decided after the allotted time.

Thus, certain bits may not be decided at the output of the ADC 10 at the point of bifurcation to the output of the modulator. In this case then, registers and output buffers of the modulator, after the ADC 10, are what ultimately decide the logic level taken at output by the bits considered. For this purpose, they may for example alter a signal equalling 0+ϵ into a signal equalling 0 and therefore decide to give the level −1 to an undecided bit. In this way, they decide the digital signal s at the output of the modulator. In the same manner, registers and the DAC decoding logic 11 are what decide the logic level taken into account to switch the current sources of the DAC 11 and that thus decide the digital signal s to be converted and returned, or "looped back", to the input of the modulator. Of course these levels depend greatly on the internal characteristics of the registers, which characteristics vary from one register to another. Consequently nothing guarantees that the decision taken by a modulator output register is consistent or homogeneous with the decision taken by an input register of the DAC 11. It is therefore possible that the analog signal returned or "looped back" to the input does not correspond faithfully to the digital output signal. The difference between these two signals should be considered to be an error added by the loop return even if it finds its origin in the operation of the ADC 10.

FIG. 5 illustrates through a schematic an example of a ΣΔ modulator according to one or more embodiments of the invention, on the basis of the same components as those of FIG. 3b and in an analogous circuit. For example, the ADC 10, the DAC 11, the summator 12 and the amplifier 13 of gain G are assembled in a closed slaving loop. The filter 14 makes it possible to filter the useful off-band frequencies and thus to produce a stable ΣΔ modulator. The analog signal e is applied to the input of the modulator, the digital signal S occurs at the output of the ADC 10 and is applied to the input of the loop return DAC 11.

One or more embodiments of the invention is in part founded on the observation that the output of the modulator such as described by FIG. 3b is not placed at the right spot. Thus, from a general standpoint, the example of FIG. 5 is aimed at placing the output of the modulator as close as possible to the loop return point, just where the difference with the input signal is calculated. Thus, in the layout of FIG. 5, the output of the modulator is situated for example after the loop return DAC 11 and after an ADC 15. The ADC 15 exploits the fact that the analog signal at the output of the DAC 11 is, in the guise of conversion of a digital signal, a sampled, quantized and held signal. Specifically, the analog signal at the output of the DAC 11 exhibits constant levels over identical time periods, these periods corresponding to the sampling frequency of the DAC 11. The levels are not only constant over each period, but also take only a finite number of discrete values. These discrete values correspond to the output levels of the DAC 11, these latter themselves corresponding to the various possibilities of switching of the current sources of the DAC 11. The analog signal at the output of the DAC 11 is said to be of "staircase" type. The ADC 15 can thus re-convert this signal into a modulator digital output signal without running the risk of making errors due to the remanence phenomenon or to the phenomenon of metastability. Specifically, on the one hand a held signal does not exhibit, by nature, any significant variation in amplitude within a very short time span. Therefore it does not have to cope with the remanence of the sample-and-hold units. Moreover, a sampled and quantized signal exhibits discrete and regularly spaced levels, thereby making it possible to maximize the deviation of the signal at the decision thresholds. Therefore it does not have to cope with the metastability of the comparators. The conversion of the ADC 15 is therefore greatly eased: it only involves returning an already sampled and quantized signal to digital form, that is to say to the form of a series of bits. This can for example be carried out by a standard ADC. But advantageously, this can also be carried out at low cost by a bottom-of-the-range ADC without sample-and-hold units, without it being possible for any quantization error to occur.

The conversion operation carried out by the ADC 15 merely restores the digital information already present on the control switches of the current sources of the DAC 11, that is to say after finally resolving the problems arising from the metastability of the ADC 10. At this juncture, the digital information is certain to remain unchanged, the control switches of the current sources of the DAC 11 constituting the last logic layers which were liable to modify it. Consequently, the analog signal s at the input of the summator 12 corresponds faithfully to the digital signal s at the output of the ADC 15, even in the case of error due to the phenomenon of metastability in the ADC 10. The difference e–s at the output of the summator is therefore still properly representative of the difference between the input and the output of the modulator, and the principle of the closed damping loop is effective in all cases. The $\Sigma\Delta$ modulator according to one or more embodiments of the invention and presented in FIG. 5 therefore properly circumvents the drawback, related to the metastability of the ADCs, of conventional $\Sigma\Delta$ modulators.

In a less efficacious embodiment, it is possible to envisage recovering, actually inside the loop return DAC 11, the voltages for controlling the switches of the current sources and transforming them into binary code which constitutes the modulator output signal. This avoids the double reciprocal conversion from digital to analog and then from analog to digital of the example of FIG. 5. But the switches themselves are then still sited downstream of the output of the modulator and are therefore still liable to alter the digital information looped back to the input. In practice, such an implementation considerably decreases the risk of having the undecided bits take different values in the output signal from the modulator and in the looped-back signal, but it does not cancel this risk.

One or more embodiments of the invention described above has the main advantage furthermore that it reduces to the minimum the size of the loop return, that is to say the circuit portion between the output of the $\Sigma\Delta$ modulator and the input of the summator. This correspondingly decreases any risk of digital deviation, whatever its origin, between the output signal and the looped-back signal and correspondingly enhances the effectiveness of the closed slaving loop.

In the case where the number of bits returned to the input differs from the number of bits provided by the ADC, a $\Sigma\Delta$ modulator with two outputs is obtained. The first output provides the LSBs and the second output provides the MSBs. The LSBs of the first output and the difference of the MSBs between the first output and the second output constitute, as it were, a new measure of the error made by the modulator on the first output, the digital exploitation of which with a view to reducing the noise in the useful band remains possible without any change.

The invention claimed is:

1. A sigma-delta modulator making it possible to convert an analog input signal into a digital output signal using an analog-to-digital converter, the digital output signal being subtracted from the input signal after conversion by a digital-to-analog converter and this difference being filtered and amplified by a high factor on input to the analog-to-digital converter, characterized in that sigma-delta modulator comprises a means for assigning in the digital output signal from the modulator and in the digital signal returned to the input of the digital-to-analog converter one and the same value to a bit when the latter is undecided at the output of the analog-to-digital converter.

2. The sigma-delta modulator as claimed in claim 1, characterized in that the digital output signal of the modulator is situated after a definitive value has been assigned to the undecided bits for the digital signal returned to the input of the modulator.

3. The sigma-delta modulator as claimed in claim 2, characterized in that the digital output signal of the modulator is the conversion into digital of the analog signal sampled, quantized and held at the output of the digital-to-analog converter.

4. The sigma-delta modulator as claimed in claim 3, characterized in that the conversion into digital of the sampled and quantized analog signal is carried out by an analog-to-digital converter.

5. The sigma-delta modulator as claimed in claim 1, characterized in that the digital output signal of the modulator is obtained by transforming into binary code the voltages for controlling the switches of the current sources of the digital-analog converter.

6. A method of sigma-delta modulation making it possible to convert an analog input signal into a digital output signal using an analog-to-digital converter, the digital output signal being subtracted from the input signal after conversion by a digital-to-analog converter and this difference being filtered and amplified by a high factor on input to the analog-to-digital converter, characterized in that a bit whose value is undecided at the output of the analog-to-digital converter is nevertheless assigned the same value in the digital output signal from the modulator and in the digital signal returned to the input of the digital-to-analog converter.

* * * * *